US012772859B2

(12) United States Patent
Hofinger

(10) Patent No.: US 12,772,859 B2
(45) Date of Patent: Oct. 20, 2026

(54) SEMICONDUCTOR FUSE WITH MEASUREMENT CIRCUIT FOR THE DETECTING OF A DRIFT OF THE GATE THRESHOLD VOLTAGE

(71) Applicant: Lisa Dräxlmaier GmbH, Vilsbiburg (DE)

(72) Inventor: Stefan Hofinger, Sankt Wolfgang (DE)

(73) Assignee: Lisa Dräxlmaier GmbH, Vilsbiburg (DE)

(*) Notice: Subject to any disclaimer, the term of this patent is extended or adjusted under 35 U.S.C. 154(b) by 397 days.

(21) Appl. No.: 18/593,187

(22) Filed: Mar. 1, 2024

(65) Prior Publication Data

US 2024/0297128 A1 Sep. 5, 2024

(30) Foreign Application Priority Data

Mar. 1, 2023 (DE) ..................... 10 2023 105 112.1

(51) Int. Cl.

| | |
|---|---|
| ***H10W 44/00*** | (2026.01) |
| ***G01R 31/26*** | (2020.01) |
| ***H02H 3/08*** | (2006.01) |
| ***H03K 17/08*** | (2006.01) |
| ***H03K 17/082*** | (2006.01) |
| ***H10W 42/80*** | (2026.01) |

(52) U.S. Cl.

CPC ........ *H10W 42/80* (2026.01); *G01R 31/2621* (2013.01); *H02H 3/08* (2013.01); *H03K 17/0822* (2013.01)

(58) Field of Classification Search

CPC ..... H10W 42/80; H03K 17/0822; H02H 3/08; G01R 31/2621

See application file for complete search history.

(56) References Cited

U.S. PATENT DOCUMENTS

| | | | |
|---|---|---|---|
| 6,838,869 B1 | 1/2005 | Rogers et al. | |
| 9,479,163 B2 | 10/2016 | Sander et al. | |
| 9,998,110 B2 | 6/2018 | Zojer | |
| 2007/0040571 A1* | 2/2007 | Dolian | G01R 31/2621 324/759.03 |
| 2017/0350934 A1* | 12/2017 | Sathik | H02M 7/217 |
| 2018/0040384 A1* | 2/2018 | Lazarov | G11C 29/50016 |
| 2022/0158632 A1 | 5/2022 | Stadter | |
| 2023/0396055 A1* | 12/2023 | Nakano | B60R 16/023 |
| 2024/0118334 A1* | 4/2024 | Aichriedler | G01R 31/2621 |

* cited by examiner

*Primary Examiner* — Scott Bauer

(74) *Attorney, Agent, or Firm* — Burris Law, PLLC

(57) ABSTRACT

A semiconductor fuse for disconnecting an electric consumer from an energy supply source for a battery electric vehicle includes at least one semiconductor switch element that is connected between the energy supply source and the electric consumer. The semiconductor switch element includes a gate control terminal for controlling a switch-on and switch-off of the semiconductor switch element. The semiconductor fuse includes: a driver circuit for applying a driver voltage that is lower than a predetermined gate threshold voltage of the semiconductor switch element at the gate control terminal of the at least one semiconductor switch element; a measurement circuit for determining a gate charge at the gate control terminal; and a control system that detects a drift of the gate threshold voltage based on the gate charge and indicates an issue with the semiconductor switch element based on the detected drift of the gate threshold voltage.

12 Claims, 5 Drawing Sheets

SEMICONDUCTOR FUSE WITH MEASUREMENT CIRCUIT FOR THE DETECTING OF A DRIFT OF THE GATE THRESHOLD VOLTAGE

CROSS-REFERENCE TO RELATED APPLICATIONS

This application is a which claims priority to and the benefit of DE 10 2023 105 112.1 filed on Mar. 1, 2023. The disclosure of the above application is incorporated herein by reference.

FIELD

The present disclosure relates to the field of electrical and electronic fuses for switching off overcurrents in battery electric vehicles. The present disclosure relates to a semiconductor fuse with a measurement circuit for detecting a drift of the gate threshold voltage for a battery electric vehicle.

BACKGROUND

The statements in this section merely provide background information related to the present disclosure and may not constitute prior art.

An electric fuse, such as a melting fuse, is commonly used when switching off sustained overcurrents within the high-voltage (HV) domain in battery electric vehicles. The melting fuse may melt due to the associated heat development and switches off the current before a threshold current is reached. An electronic fuse with semiconductors may be used as an alternative thereto. In an electronic fuse, the overcurrent are first detected before the switch-off process can be initiated. For this purpose, the overcurrent that runs over the electric fuse element may be detected and evaluated. Various methods that perform a switch-off based on the calculation of the line temperature or the average current exist for the evaluation. However, it has been shown that such a switch-off is too slow, and the electronic fuse may be adversely affected in the event of suddenly occurring short-circuit incidents.

SUMMARY

This section provides a general summary of the disclosure and is not a comprehensive disclosure of its full scope or all of its features.

The present disclosure provides a concept for switching off overcurrents in battery electric vehicles.

The present disclosure is based on the idea of providing a semiconductor-based fuse or semiconductor fuse, also referred to in the following as digital fuse ("dFuse"), which detects threshold currents, such as, for example, short-circuit currents, and can disconnect them faster than circuit breakers, melting fuses, or Pyrofuses. Diagnostics are predetermined for the semiconductor depending on the technology, such as, for example, SIC-MOSFET, IGBT, SI-MOSFET, etc. in order to provide a disconnection with the semiconductor fuse according to ASIL B in the HV domain. One such diagnostic is the gate threshold voltage drift detection with the aid of a gate charge measurement, as presented in this disclosure. This provides that no undesired switch-on occurs or that a switch-off is provided in the event of a short circuit.

The gate threshold voltage drift detection presented herein functions as follows: before the main fuses or, depending on the installation location of the dFuse, the second main fuse activates the entire system, a voltage is applied at the control terminal (gate in the case of a MOSFET) that is lower than the typical gate threshold voltage, for example, 4V.

The gate charge may be determined with the aid of a voltage measurement at the gate resistance and subsequent integration. The linear gate-source capacitance is charged up to the threshold voltage. If a drift of the gate threshold voltage has occurred, the non-linear gate-drain capacitance (Miller capacitance) is also charged and represents a jump in the gate charge. This non-linear increase may be detected with the aid of a suitable measurement circuit and a shift of the gate threshold voltage can thus be deduced.

The gate threshold voltage drift detection can be used here in all types of electronic fuses or dFuses or semiconductor fuses, both within the low-voltage (LV) domain and within the high-voltage (HV) domain. An HV semiconductor fuse that fulfills the ASIL-B or higher standards for disconnection may be provided with the gate threshold voltage drift detection described herein. Conventional products may not fulfill these standards.

According to a first aspect, the present disclosure provides a semiconductor fuse for disconnecting an electric consumer from an energy supply source for a battery electric vehicle, wherein the semiconductor fuse includes: at least one semiconductor switch element that can be connected between the energy supply source and the electric consumer, wherein the at least one semiconductor switch element includes a gate control element for controlling a switching on and off of the semiconductor switch element in order to connect or disconnect the electric consumer from the energy supply source; a driver circuit configured for applying a driver voltage at the gate control terminal of the at least one semiconductor switch element, the driver voltage being lower than a predetermined gate threshold voltage of the at least one semiconductor switch element; a measurement circuit configured for determining a gate charge at the gate control terminal of the at least one semiconductor switch element; and a control system configured for detecting a drift of the gate threshold voltage based on the gate charge, and for indicating a malfunction of the at least one semiconductor switch element in the event where the drift of the gate threshold voltage is detected.

In the event where the drift of the gate threshold voltage is detected, the control system may diagnose a malfunction of the at least one semiconductor switch element and quickly switch off the at least one semiconductor switch element so that it may be exchanged.

Due to the gate threshold voltage drift detection, such a semiconductor fuse offers the technical advantage of the diagnosis of whether the semiconductor switch element is still functional and can be switched off. The semiconductor fuse provides that an undesired switch-on is inhibited, or that a switch-off is provided in the event of a short circuit.

The semiconductor fuse can thus provide functions according to ASIL standards.

In a field-effect transistor or MOSFET, the gate threshold voltage is the gate voltage or gate source voltage at which an appreciable current flows in relation to the maximum drain current. The gate threshold voltage may be taken from data sheets of the transistors. In a field-effect transistor, the power path of the semiconductor switch element is the path between drain and source terminal.

According to one form of the semiconductor fuse, the control system is configured for controlling the driver circuit, applying the driver voltage at the gate control terminal of the at least one semiconductor switch element; and the control system is configured for controlling the measurement circuit to determine the gate charge at the control terminal of the at least one semiconductor switch element in response to the application of the driver voltage at the gate control terminal.

This results in that the measurement circuit can work synchronously with the driver circuit, and the gate charge can be determined.

According to one form of the semiconductor fuse, the gate control terminal of the at least one semiconductor switch element includes a gate resistor; and the driver circuit is configured for applying the driver voltage at the gate resistor of the gate control terminal.

This results in a voltage difference over the gate resistor which may be used for determining a current flow, and thus the gate charge.

According to one form of the semiconductor fuse, the measurement circuit is configured for determining a gate current at the gate resistor and the gate charge at the gate control terminal based on the gate current.

This may result in the gate charge being easily determined via the gate current, since a mathematical relationship exists between gate current and gate charge.

According to one form of the semiconductor fuse, the measurement circuit is configured for determining the gate current based on a difference of the given driver voltage applied at the gate resistor and a given voltage applied at the gate control terminal.

This results in that the gate current can be easily determined via Ohm's law since the gate current can be determined from the differential voltage at the gate resistor and the gate resistance with a known value of the gate resistance.

According to one form of the semiconductor fuse, the measurement circuit is configured for determining the gate charge based on a temporal integration of the gate current.

This results in the gate charge can be easily determined, since the relationship between electric current I and charge Q is given according to the formula $I=dQ/dt$.

According to one form of the semiconductor fuse, the control system is configured for detecting the drift of the gate threshold voltage based on a non-linear increase of the gate charge.

This results in that the drift of the gate threshold voltage can be determined. If a drift of the gate threshold voltage has occurred, the non-linear gate-drain capacitance is also charged in addition to the gate-source capacitance. A non-linear increase of the gate charge may be associated therewith.

According to one form of the semiconductor fuse, the non-linear increase of the gate charge is based on a non-linear charging process of a gate-drain capacitance of the at least one semiconductor switch element.

This results in that the non-linear increase of the gate charge may be easily detectable, with the result that the drift of the gate threshold voltage is easily detectable.

According to one form of the semiconductor fuse, the control system is configured for detecting the drift of the gate threshold voltage based on a comparison of the gate charge with a predetermined sequence of the gate charge with respect to a gate source voltage of the at least one semiconductor switch element.

This results in this characteristic being the same for every semiconductor switch element over the sequence of the gate charge, with the result that the drift of the gate threshold voltage may be determined based on data sheets of the semiconductor switch element.

According to one form of the semiconductor fuse, the predetermined sequence of the gate charge increases linearly with respect to the gate source voltage of the at least one semiconductor switch element up to the gate threshold voltage, then displays a jump and increases further after the jump.

This results in that a small drift of the gate threshold voltage already has large effects on the gate charge due to this characteristic with the jump, so that the drift of the gate threshold voltage may be determined based on the gate charge.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The figures are merely schematic representations and serve only to clarify the present disclosure. Identical or functionally identical elements are provided throughout with the same reference numerals.

Figure 1:
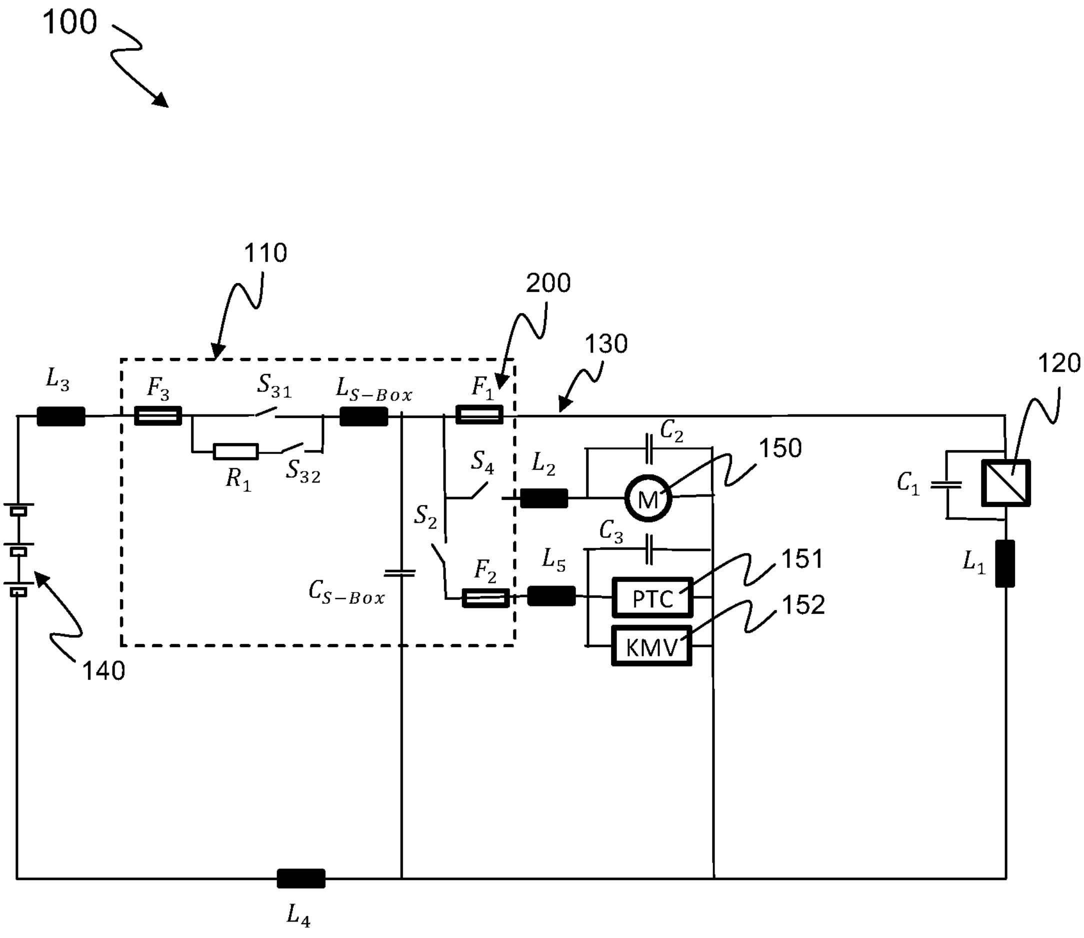
FIG. 1 shows a system circuit diagram of a charging system for charging a battery of a battery electric vehicle.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In the following detailed description, reference is made to the accompanying drawings which are a part thereof, and in which specific forms are shown as illustration, in which the present disclosure can be implemented. It is understood that other forms can also be used, and structural or logical changes can also be undertaken without deviating from the concept of the present disclosure. The following detailed description is therefore not to be understood in a limiting sense. It is furthermore understood that the features of the different examples described herein can be mutually combined if not specifically indicated otherwise.

The aspects described with reference to the drawings, in which identical reference numerals generally refer to identical elements. Numerous specific details are presented in the following description for the purpose of explanation in order to convey a detailed understanding of one or more aspects of the present disclosure.

However, one or more aspects can be embodied with a lesser degree of the specific details. It is understood that other forms can be used, and structural or logical changes can be undertaken without deviating from the concept of the present disclosure.

FIG. 1 shows a schematic circuit diagram of a charging system 100 for charging a battery of a battery electric vehicle.

The charging system 100 comprises electrical and electronic components of the vehicle, which are shown on the left side, and electrical and electronic components of the charging infrastructure, which are shown on the right side. The charging infrastructure comprises a charging column 120 for charging the battery 140 of the vehicle, to which a capacitor $C_1$ is connected in parallel and an inductance $L_1$ is connected in series.

On the vehicle side, the electrical and electronic components of the vehicle comprise a battery 140 for powering the vehicle, or an HV storage connected in series to the inductance $L_3$ at a first pole and an inductance $L_4$ at a second pole of the battery 140 in the charging current path 130.

An S-Box 110 (switch box or switchbox) is connected in the vehicle in the charging current path 130, wherein the S-Box 110 facilitates a charging of the battery 140. The S-Box 110 is also connected to a traction path as well as one or more auxiliary consumer paths. The S-Box 110 controls the charging of the battery 140 and the operation of the traction path and the auxiliary consumer paths via the battery 140. Switches for switching on the charging infrastructure are not shown.

The traction path comprises an electric motor 150, to which a capacitor $C_2$ is connected in parallel and an inductance $L_2$ is connected in series.

The auxiliary consumer paths comprise one or more electronic components connected in parallel, such as, for example, PTC 151 and KMV 152, to which a capacitor $C_3$ is connected in parallel and an inductance $L_5$ is connected in series.

The S-Box 110 comprises a charging infrastructure-side fuse $F_1$ 200, which can be a semiconductor fuse 200 according to the present disclosure. The S-Box 110 further comprises a battery-side fuse $F_3$, and inductance $L_{S\text{-}Box}$, and a circuit with switches $S_{31}$ and $S_{32}$ connected in parallel, which are connected in series to the fuse $F_1$ in the charging current path 130. The battery-side fuse $F_3$ can also be a semiconductor fuse 200 according to the present disclosure. A second circuit with switches $S_4$ and $S_2$ branches off between the fuse $F_1$ and the inductance $L_{S\text{-}Box}$ in order to connect the traction path and the auxiliary consumer paths to the battery 140 when the vehicle is disconnected from the charging infrastructure. The auxiliary consumer paths are connected to the second circuit via a fuse $F_2$. The fuse $F_2$ can also be a semiconductor fuse 200 according to the present disclosure in which the fuse $F_2$ then does not serve to disconnect the charging current path 130 but rather to disconnect the current path between battery 140 and auxiliary consumers 151, 152.

The S-Box 110 further comprises a capacitor $C_{S\text{-}Box}$ connected in parallel to the charging infrastructure.

Figure 2:
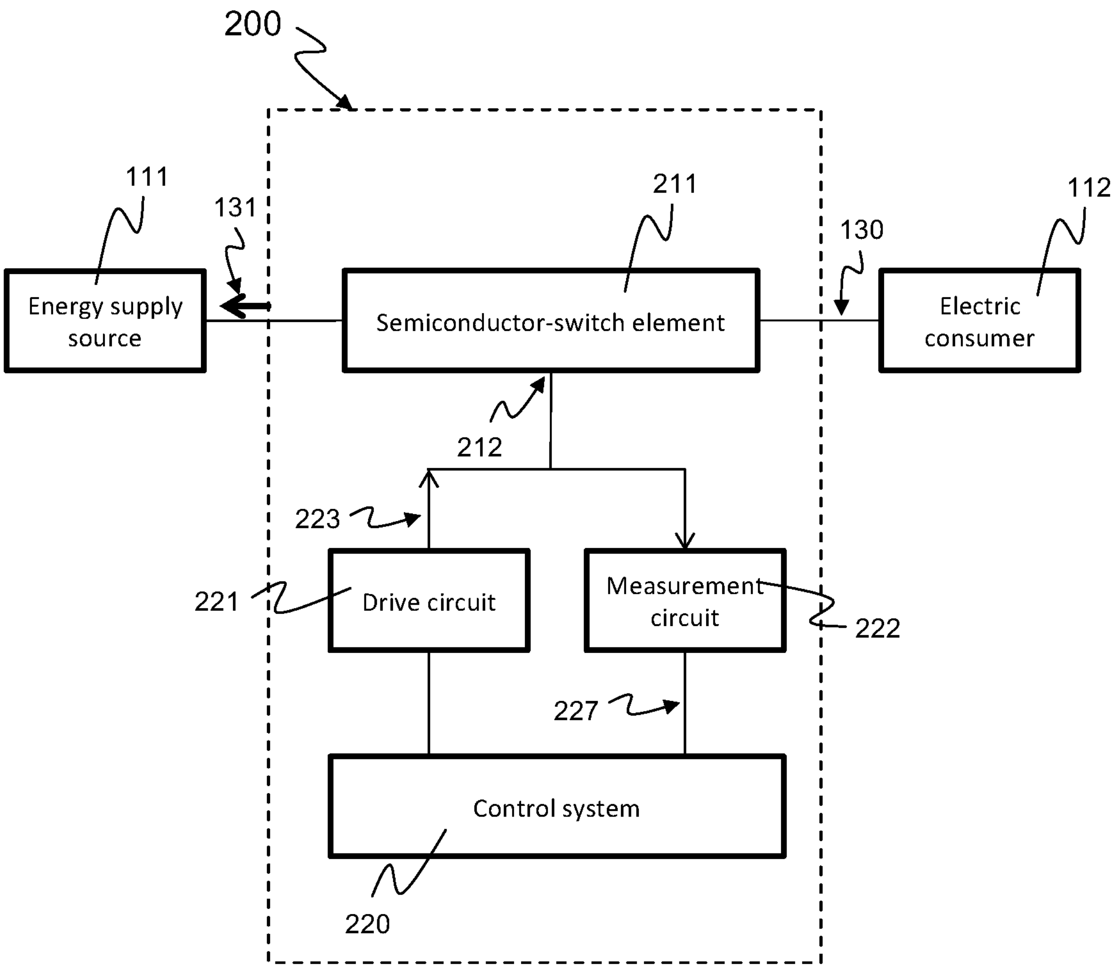
FIG. 2 shows a simplified block circuit diagram of a semiconductor fuse for a battery electric vehicle according to the present disclosure.

FIG. 2 shows a simplified block circuit diagram of a semiconductor fuse 200 according to the present disclosure for a battery electric vehicle.

The semiconductor fuse 200 serves for securely disconnecting an electrical consumer 112 from an energy supply source 111 for a battery electric vehicle. This can be, for example, a disconnection of the battery 140 from the charging column 120, as shown in FIG. 1, or a disconnection of the electric motor 150 or the auxiliary consumers 151, 152 from the battery 140, as shown in FIG. 1.

The semiconductor fuse 200 comprises at least one semiconductor switch element 211 that can be connected between the energy supply source 111 and the electrical consumer 112. In FIG. 2, one such semiconductor switch element 211 is shown, although there can be a plurality of semiconductor switch elements here, which are connected, for example, in parallel to each other in order to increase the current-carrying capacity of the entire circuit, or also a parallel circuit of semiconductor switch element pairs, in which the switch elements of the respective pairs are oppositely interconnected in series in order to produce a bidirectional blocking.

The at least one semiconductor switch element 211 includes a gate control terminal 212 for controlling a switch-on and switch-off of the semiconductor switch element 211 in order to connect the electrical consumer 112 to the energy supply source 111 or disconnect it from the energy supply source 111. The semiconductor switch element 211 can be, for example, a MOSFET or an IGBT in which the gate control terminal 212 corresponds to the gate terminal.

The semiconductor fuse 200 comprises a driver circuit 221 configured for applying a driver voltage 223 at the gate control terminal 212 of the at least one semiconductor switch element 211, in which the driver voltage 223 is lower than a predetermined gate threshold voltage 501 (see FIG. 5) of the at least one semiconductor switch element 211.

The predetermined gate threshold voltage 501 is also referred to as the nominal gate threshold voltage and can be read from data sheets of the semiconductor switch elements 211.

A driver voltage 223 which is lower by a predetermined threshold value than the predetermined gate threshold voltage 501 can be applied here so that a natural fluctuation of the gate threshold voltage 501 does not lead to an inadvertent drift detection.

A lowering of the threshold voltage is desired for the disconnection and also for the case to be detected. A positive drift of the gate threshold voltage 501 could also be desired for other applications. For this purpose, it could be desired to apply a driver voltage 223 with which such a positive drift can be detected, for example, a driver voltage 223 that is higher than the gate threshold voltage 501.

Figure 5:
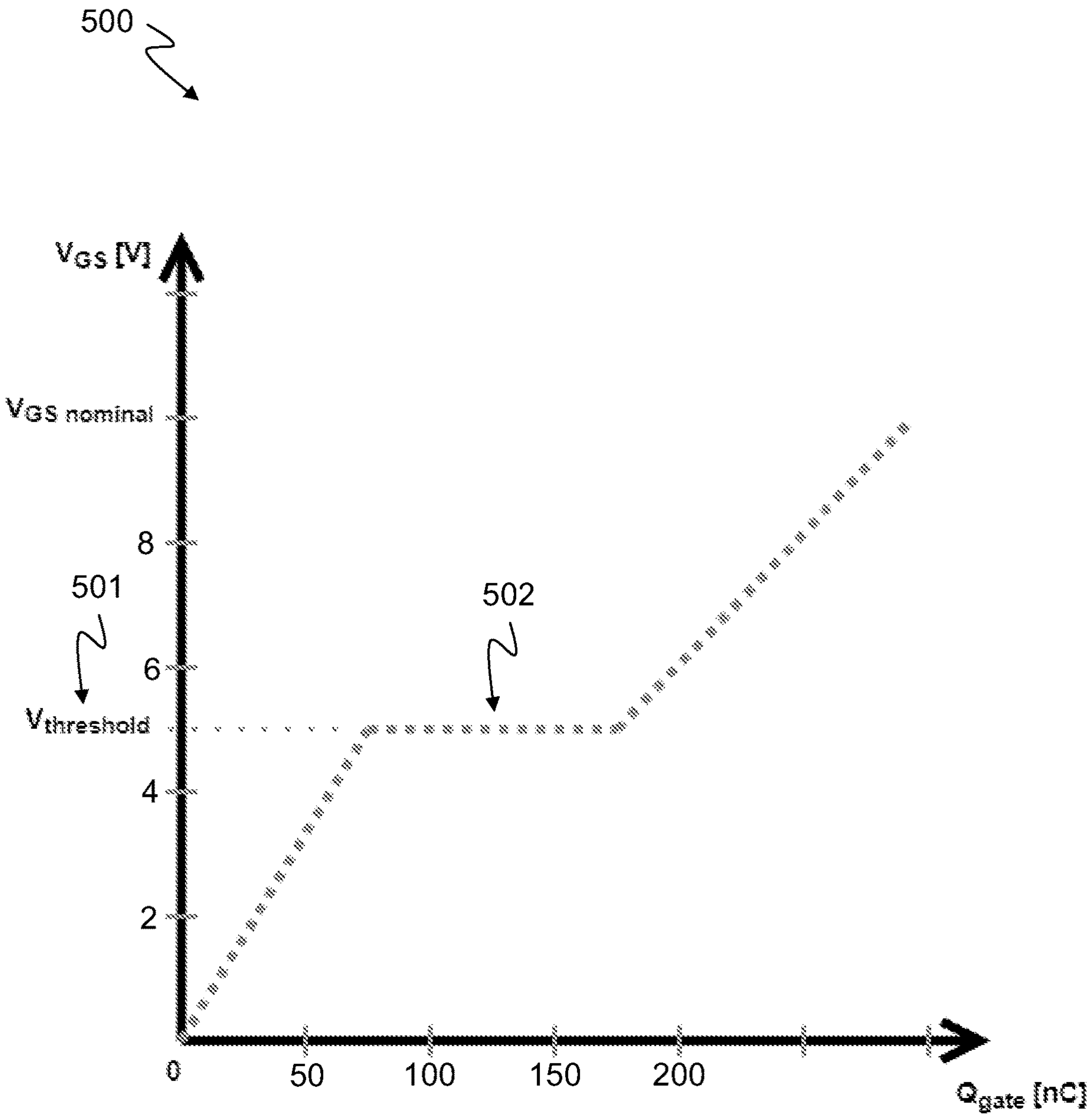
FIG. 5 shows a diagram of an example sequence of the gate charge with respect to the gate source voltage according to a data sheet of the semiconductor switch element.

In FIG. 5 an example sequence 500 of the gate charge with respect to the gate source voltage according to a data sheet of the semiconductor switch element 211 from which the characteristic gate threshold voltage 501 can be seen is represented.

Referring back to FIG. 2, the semiconductor fuse 200 includes a measurement circuit 222, which is configured for determining a gate charge 227 at the gate control terminal 212 of the at least one semiconductor switch element 211.

The semiconductor fuse 200 further comprises a control system 220 that is configured for detecting a drift of the gate threshold voltage 501 based on the gate charge 227 and to indicate an issue with the at least one semiconductor switch element 211 in the event of detection of the drift of the gate threshold voltage 501.

The control system 220 can be configured for controlling the driver circuit 221 to apply the driver voltage 223 at the gate control terminal 212 of the at least one semiconductor switch element 211.

The control system 220 can be configured for controlling the measurement circuit 222 to determine the gate charge 227 at the gate control terminal 212 of the at least one semiconductor switch element 211 in response to the application of the driver voltage 223 at the gate control terminal 212.

Figure 3:
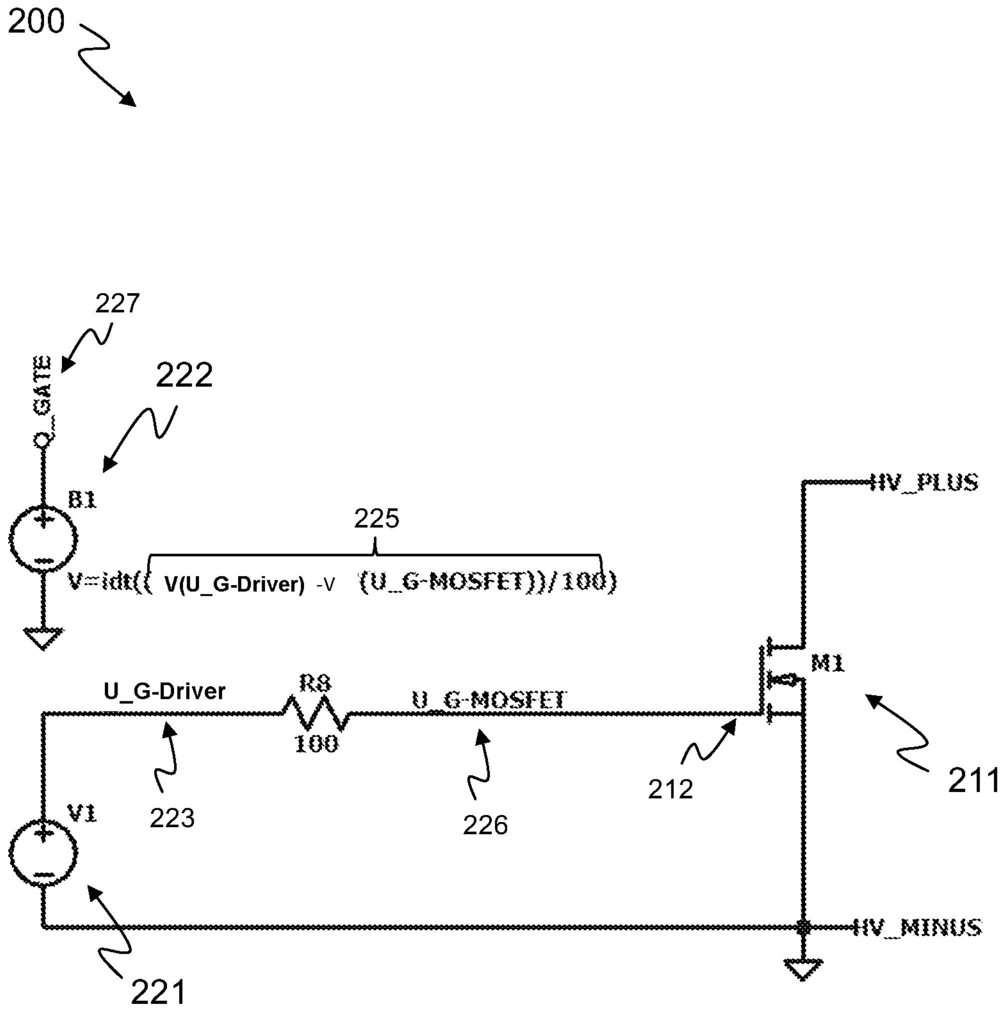
FIG. 3 shows a circuit diagram of a semiconductor fuse according to one form of the present disclosure.

The gate control terminal 212 of the at least one semiconductor switch element 211 can include a gate resistor R8, as shown in more detail in FIG. 3. The driver circuit 221 can be configured for applying the driver voltage 223 at the gate resistor R8 of the gate control terminal 212.

The measurement circuit 222 can be configured for determining a gate current 225 at the gate resistor R8 and the gate charge 227 at the gate control terminal 212 based on the gate current 225, as shown in more detail in FIG. 3.

The measurement circuit 222 can be configured for determining the gate current 225 based on a difference of the driver voltage 223 applied at the gate resistor R8, and a gate voltage 226 applied at the gate control terminal 212, as shown in more detail in FIG. 3.

The measurement circuit 222 can be configured for determining the gate charge 227 based on an integration of the gate current 225 over the time, as shown in more detail in FIG. 3.

The control system 220 can be configured for detecting the drift of the gate threshold voltage 501 based on a non-linear increase of the gate charge 227, for example, corresponding to the representation in FIG. 5.

The non-linear increase of the gate charge 227 can be based on a non-linear charging process of a gate-drain capacitance of the at least one semiconductor switch element 211, as described in more detail further below.

The control system 220 can be configured for detecting the drift of the gate threshold voltage 501 based on a comparison of the gate charge 227 to a predetermined sequence 500 of the gate charge 227 with respect to a gate source voltage of the at least one semiconductor switch element 211.

The predetermined sequence 500 of the gate charge 227 with respect to the gate source voltage of the at least one semiconductor switch element 211 can rise linearly, as shown in FIG. 5, up to the gate threshold voltage 501, then display a jump 502, and increase further after the jump 502.

FIG. 3 shows a circuit diagram of a semiconductor fuse 200 according to one form of the present disclosure.

The semiconductor fuse 200 in FIG. 3 corresponds to the semiconductor fuse 200 shown in FIG. 2, wherein details are shown in FIG. 3 regarding the interconnection of the driver circuit 221 and the measurement circuit 222 with the semiconductor switch element 211. The semiconductor switch element 211 can be a MOSFET (M1), as shown by way of example in FIG. 3.

The semiconductor switch element 211 includes a gate control terminal 212 for controlling a switch-on and switch-off of the semiconductor switch element 211. The gate control terminal 212 corresponds to the gate terminal of the MOSFET M1, as shown in FIG. 3.

The driver circuit 221 is configured for applying a driver voltage (U_G-Driver) 223 at the gate control terminal 212 of the MOSFET M1 which is lower than a predetermined gate threshold voltage 501 of the MOSFET M1. The driver circuit 221 can be, for example, a voltage source V1.

The measurement circuit 222 is configured for determining a gate charge 227 (Q-GATE) at the gate control terminal 212 of the MOSFET M1.

The control system 220 (see FIG. 2) is configured for detecting a drift of the gate threshold voltage 501 based on the gate charge 227, and for switching off the MOSFET M1 in the event the drift of the gate threshold voltage 501 is detected.

The gate control terminal 212 of the MOSFET M1 includes a gate resistor R8. The driver circuit 221 is configured for applying the driver voltage 223 to the gate resistor R8 of the gate control terminal 212.

The measurement circuit 222 is configured for determining a gate current 225 at the gate resistor R8 and the gate charge 227 at the gate control terminal 212 based on the gate current 225, as shown in FIG. 3. Here, the gate current 225 is determined as (V(U_G-Driver)−V(U_G-MOSFET))/100, wherein the 100 corresponds to a resistance value of the gate resistor R8.

The measurement circuit 222 is configured for determining the gate current 225 based on a difference of the driver voltage V(U_G-Driver) 223, applied at the gate resistor R8 and a gate voltage V(U_G-MOSFET) 226 applied at the gate control terminal 212, as shown in FIG. 3.

The measurement circuit 222 is configured for determining the gate charge 227 (Q_GATE) based on an integration of the gate current 225 over the time, as shown in FIG. 3: V=idt((V(U_G-Driver)−V(U_G-MOSFET))/100).

The mode of operation of the semiconductor fuse 200 is explained in more detail in the following.

Before the main fuses or, depending on the installation location of the dFuse, the second main fuse enables or activates the entire system (see FIG. 1), a voltage is applied at the gate control terminal 212 (gate in the case of a MOSFET) of the dFuse 200 with the aid of a driver circuit 221 (V1), which voltage is lower than the typical gate threshold voltage 226 (U_G-MOSFET).

With a measurement circuit 222 (shown in FIG. 3 as B1), the differential voltage U_G-Driver-U_G-MOSFET is measured at the gate resistor R8 and divided by the value of R8 (corresponds to the gate current 225) and subsequently integrated (corresponds to the gate charge 227).

Figure 4:
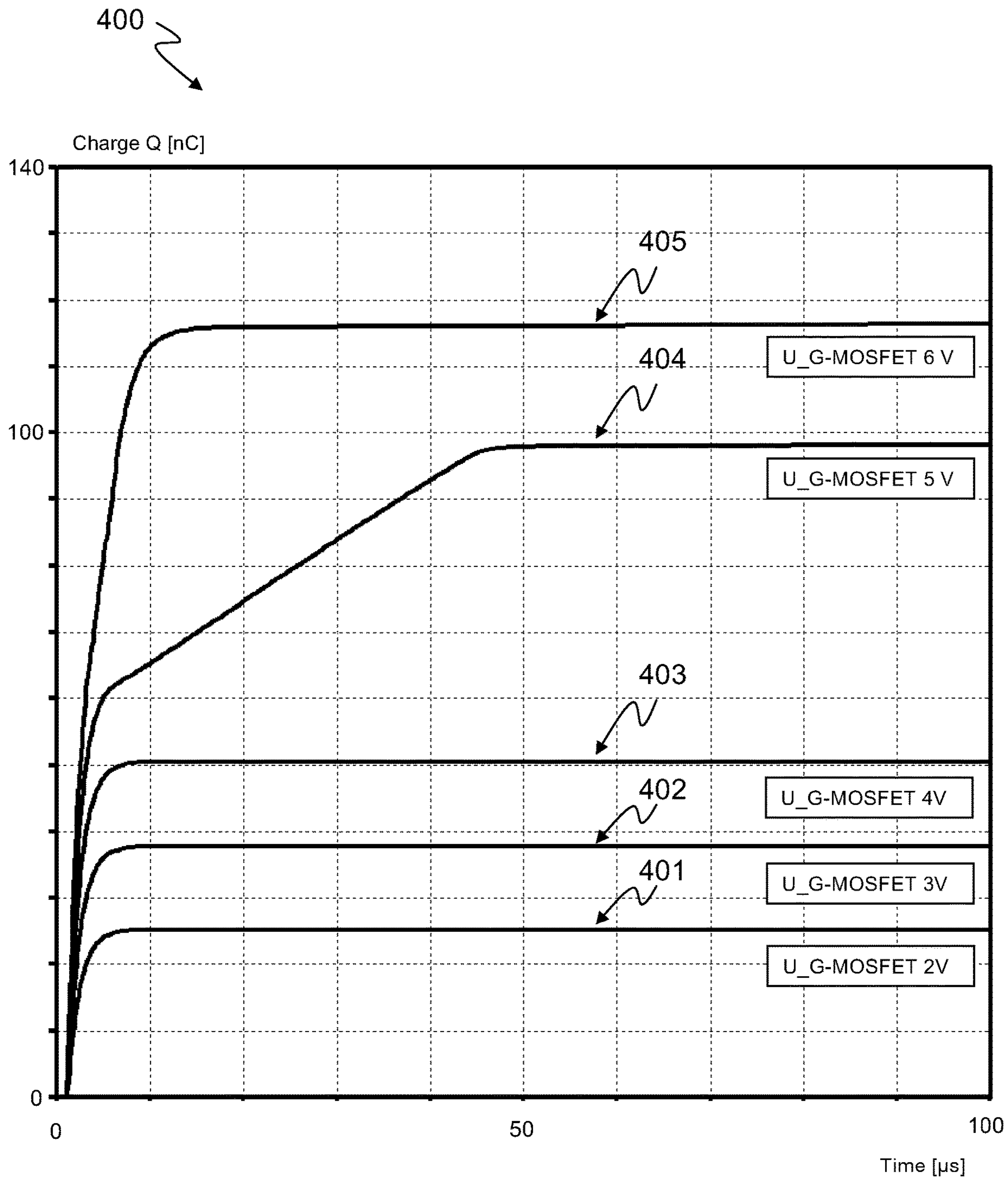
FIG. 4 shows a diagram with example time sequences of the gate charge with various gate voltages.

FIG. 4 shows a diagram 400 with example time sequences of the gate charge 227 with different gate voltages.

Until the gate threshold voltage is reached, the gate charge 227 increases linearly with the gate voltage 226, as can be seen from the curves 401, 402, 403. If a drift of the gate threshold voltage has happened also the non-linear gate-drain capacitance is charged in addition to the gate-source capacitance. A non-linear increase of the gate charge 227 is detected, as can be seen from the curves 404 and 405.

FIG. 5 shows a diagram of an example sequence 500 of the gate charge 227 with respect to the gate source voltage according to a data sheet of the semiconductor switch element 211.

The values for the gate charge 227 can be detected and the non-linear increase when the threshold voltage 501 is reached are documented in the component data sheets, as shown by way of example in FIG. 5.

As can be seen from the sequence in FIG. 5, the measurement is in order with a gate voltage of 4V and approximately 50 nC charge. In contrast, with a gate voltage of 4V and approximately 90 nC charge, the measurement is not in order since the Miller capacitance has been charged and the gate threshold voltage 501 has shifted downward.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A semiconductor fuse for disconnecting an electric consumer from an energy supply source for a battery electric vehicle, the semiconductor fuse comprising:

at least one semiconductor switch element configured to be connected between the energy supply source and the electric consumer, the at least one semiconductor switch element includes a gate control terminal for controlling a switch-on and switch-off of the at least one semiconductor switch element to connect or disconnect the electric consumer from the energy supply source;

a driver circuit configured to apply a driver voltage at the gate control terminal of the at least one semiconductor switch element, the driver voltage lower than a predetermined gate threshold voltage of the at least one semiconductor switch element;

a measurement circuit configured to determine a gate charge at the gate control terminal of the at least one semiconductor switch element; and a control system configured to detect a drift of the predetermined gate threshold voltage based on the gate charge and to diagnose an issue with the at least one semiconductor switch element based on the detected drift of the predetermined gate threshold voltage.

2. The semiconductor fuse according to claim 1, wherein the control system is configured to control the driver circuit to apply the driver voltage at the gate control terminal of the at least one semiconductor switch element, and the control system is configured to control the measurement circuit to determine the gate charge at the gate control terminal of the at least one semiconductor switch element in response to applying the driver voltage at the gate control terminal.

3. The semiconductor fuse according to claim 1, wherein the gate control terminal of the at least one semiconductor switch element includes a gate resistor, and the driver circuit is configured to apply the driver voltage at the gate resistor of the gate control terminal.

4. The semiconductor fuse according to claim 3, wherein the measurement circuit is configured to determine a gate current at the gate resistor and to determine the gate charge at the gate control terminal based on the gate current.

5. The semiconductor fuse according to claim 4, wherein the measurement circuit is configured to determine the gate current based on a difference of the driver voltage applied at the gate resistor and a gate voltage applied at the gate control terminal.

6. The semiconductor fuse according to claim 4, wherein the measurement circuit is configured to determine the gate charge based on a time integration of the gate current.

7. The semiconductor fuse according to claim 1, wherein the control system is configured to detect the drift of the predetermined gate threshold voltage based on a non-linear increase of the gate charge.

8. The semiconductor fuse according to claim 7, wherein the non-linear increase of the gate charge is based on a non-linear charging process of a gate-drain capacitance of the at least one semiconductor switch element.

9. The semiconductor fuse according to claim 1, wherein the control system is configured to detect the drift of the predetermined gate threshold voltage based on a comparison of the gate charge to a predetermined sequence of the gate charge with respect to a gate source voltage of the at least one semiconductor switch element.

10. The semiconductor fuse according to claim 9, wherein the predetermined sequence of the gate charge with respect to the gate source voltage of the at least one semiconductor switch element increases linearly up to the predetermined gate threshold voltage.

11. The semiconductor fuse according to claim 10, wherein the predetermined sequence of the gate charge with respect to the gate source voltage of the at least one semiconductor switch element has a jump in the gate charge at the predetermined gate threshold voltage.

12. The semiconductor fuse according to claim 11, wherein the predetermined sequence of the gate charge with respect to the gate source voltage of the at least one semiconductor switch element increases after the jump.

* * * * *